(12) United States Patent
Takeuchi et al.

(10) Patent No.: US 7,411,192 B2
(45) Date of Patent: Aug. 12, 2008

(54) FOCUSED ION BEAM APPARATUS AND FOCUSED ION BEAM IRRADIATION METHOD

(75) Inventors: Koichiro Takeuchi, Hitachinaka (JP); Tohru Ishitani, Hitachinaka (JP); Yoichi Ose, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 301 days.

(21) Appl. No.: 11/189,901

(22) Filed: Jul. 27, 2005

(65) Prior Publication Data

US 2006/0022150 A1 Feb. 2, 2006

(30) Foreign Application Priority Data

Jul. 29, 2004 (JP) ............................. 2004-222212

(51) Int. Cl.
H01J 1/50 (2006.01)
H01J 37/08 (2006.01)
G21K 7/00 (2006.01)
G21K 1/093 (2006.01)

(52) U.S. Cl. ...................... 250/311; 250/306; 250/307; 250/310; 250/396 ML; 250/396 R (58) Field of Classification Search ............ 250/492.21, 250/311
See application file for complete search history.

(56) References Cited

U.S. PATENT DOCUMENTS

| 5,504,340 | A | * | 4/1996 | Mizumura et al. | ...... | 250/492.21 |
| 5,583,344 | A | * | 12/1996 | Mizumura et al. | ...... | 250/492.21 |
| 5,825,035 | A | * | 10/1998 | Mizumura et al. | ...... | 250/423 R |
| 7,161,159 | B2 | * | 1/2007 | Hill et al. | ................. | 250/399 |
| 2005/0035291 | A1 | * | 2/2005 | Hill et al. | ................. | 250/309 |
| 2005/0184251 | A1 | * | 8/2005 | Oi et al. | .................... | 250/492.3 |
| 2005/0184252 | A1 | * | 8/2005 | Ogawa et al. | ............ | 250/492.3 |
| 2006/0022150 | A1 | * | 2/2006 | Takeuchi et al. | ....... | 250/492.21 |
| 2006/0097166 | A1 | * | 5/2006 | Ishitani et al. | .............. | 250/310 |
| 2007/0158555 | A1 | * | 7/2007 | Ward et al. | .................. | 250/309 |
| 2007/0158556 | A1 | * | 7/2007 | Ward et al. | .................. | 250/309 |
| 2007/0158557 | A1 | * | 7/2007 | Ward et al. | .................. | 250/309 |
| 2007/0158558 | A1 | * | 7/2007 | Ward et al. | .................. | 250/309 |
| 2007/0187621 | A1 | * | 8/2007 | Ward et al. | ............. | 250/492.21 |
| 2007/0194226 | A1 | * | 8/2007 | Ward et al. | .................. | 250/309 |
| 2007/0194251 | A1 | * | 8/2007 | Ward et al. | ............. | 250/492.21 |
| 2007/0210250 | A1 | * | 9/2007 | Ward et al. | .................. | 250/307 |

(Continued)

FOREIGN PATENT DOCUMENTS

JP 59138044 8/1984

(Continued)

*Primary Examiner*—David A. Vanore
*Assistant Examiner*—Bernard Souw
(74) *Attorney, Agent, or Firm*—McDermott Will & Emery LLP (57) ABSTRACT

A focused ion beam apparatus and a focused ion beam irradiation method are disclosed. Even in the case where a magnetic field exists on the optical axis of an ion beam and the particular magnetic field undergoes a change, the ion beam is focused without separating the isotopes on the sample at the same ion beam spot position as if the magnetic field is not existent. A canceling magnetic field is generated on the optical axis of the ion beam from a canceling magnetic field generator thereby to offset the deflection of the ion beam due to the external magnetic field.

28 Claims, 10 Drawing Sheets

U.S. PATENT DOCUMENTS

| | | | |
|---|---|---|---|
| 2007/0210251 A1* | 9/2007 | Ward et al. | 250/309 |
| 2007/0221843 A1* | 9/2007 | Ward et al. | 250/309 |
| 2008/0023641 A1* | 1/2008 | Takeuchi et al. | 250/396 ML |
| 2008/0035860 A1* | 2/2008 | Hill et al. | 250/492.3 |

FOREIGN PATENT DOCUMENTS

| | | |
|---|---|---|
| JP | 07-296756 | 11/1995 |
| JP | 11250843 | 9/1999 |
| JP | 11-329318 | 11/1999 |

* cited by examiner

DISTANCE (mm) FROM SAMPLE
ON ION BEAM OPTICAL AXIS

FIG.3

DISTANCE (mm) FROM SAMPLE
ON ION BEAM OPTICAL AXIS

FOCUSED ION BEAM APPARATUS AND FOCUSED ION BEAM IRRADIATION METHOD

BACKGROUND OF THE INVENTION

1. Field of the Invention

This invention relates to a technique for offsetting the deflection of an ion beam due to a geomagnetic field or a magnetic field intruding into an ion optics from another device and thus forming the ion beam spot on a sample at substantially the same position as if there is no magnetic field and a technique for avoiding the split of a beam spot which otherwise might occur in the case where the ion beam contains a plurality of types of isotopes.

2. Description of the Related Art

A FIB (focused ion beam) apparatus is used in practical applications to microprocess a sample or to observe an image of the sample by radiating a finely focused ion beam on the sample. The ion beam is deflected by the Lorentz force in the presence of a magnetic field on the optical axis. The accelerating voltage of the FIB apparatus is normally about several tens of kV, and therefore the beam spot may be displace several tens of μm or more by the geomagnetic field. Further, the normally used ion specie Ga Ga contains two types of isotopes $Ga^{69}$ and $Ga^{71}$ deflected to different degrees by a magnetic field, thereby posing the problem that the beam is split into two. The ion beam is split also in the case where ions form a cluster. For the beam spot displacement of about several tens of μm, the distance between the two types of ion beams split may reach about 1 μm depending on the difference of the mass-to-charge ratio. It is essential to avoid or suppress this phenomenon for the FIB apparatus which is used for the purpose of microprocessing on the order of nanometer. The simplest method of excluding the magnetic field on the optical axis is to magnetically shield the housing by covering it with a magnetic material as in the prior art. JP-A-11-329318 discloses a technique for magnetically shielding also the forward end portion of the FIB apparatus.

It is difficult, however, to magnetically shield a sample including the neighborhood thereof completely. The sample and the neighborhood thereof could be magnetically shielded almost completely if the whole apparatus is covered with a magnetic shield. It is often desired to form a hole in the magnetic shield, and in such a case, the magnetic field intrudes by way of the hole.

The FIB apparatus normally comprises an electric deflector for radiating the ion beam at the desired position on a sample. Although the displacement of the ion beam spot on the sample due to a magnetic field can be canceled using the electric deflector, it is impossible to prevent the separation of isotopes at the same time. The Wien filter is another means known to deflect the ion beam positively. However, this filter is used rather the purpose of strongly separating isotopes and removing the unnecessary isotope components by bombarding a wall (JP-A-7-296756). Therefore, the exit of the ion beam is very narrow, and in the presence of an external magnetic field, it is difficult for the ion beam to pass through the exit. In view of this, demand has arisen for a technique by which neither the ion beam spot is displaced nor isotopes separated even in the presence of a magnetic field on the optical axis of the ion beam.

This problem is more serious for the FIB-SEM comprising a FIB column and a SEM column combined with each other. The FIB-SEM has recently began to find practical applications as a combination of the observation SEM (scanning electron microscope) and the FIB apparatus to observe a sample processed by the FIB apparatus with a higher resolution. The SEM, which normally has an electromagnet as an objective lens, is required to use the type of a lens called the semi-in or snorkel lens leaking a magnetic field toward the sample to achieve a higher resolution. This magnetic field intrudes into an area on the optical axis of the FIB apparatus and strongly deflects the ion beam. In the case where the ion beam is configured of a plurality of types of beams having different mass-to-charge ratios, therefore, these beams are split from each other. In view of the fact that the ion beam is required to be radiated on a sample in the vicinity of the objective lens of the SEM, on the other hand, the optical axis of the ion beam cannot be magnetically shielded sufficiently. Another problem is that the arrangement of a magnetic shield in the vicinity of the SEM objective lens disturbs the magnetic field of the SEM objective lens and adversely affects the resolution of the SEM.

No technique has been disclosed to solve this problem. Under the circumstances, a FIB-SEM application using the SEM leaking the magnetic field to the neighborhood of a sample uses a method in which the magnetic field of the objective lens of the SEM is suspended during the microprocessing of the sample by the FIB apparatus while the FIB apparatus is stopped during the observation of the sample under the SEM. Even after the exciting current of the objective lens of the SEM is stopped, however, the magnetic field remains. This residual magnetic field changes with time, thereby posing the problem that the ion beam spot also moves with time. To avoid this problem, JP-A-11-329320 discloses a technique in which a demagnetization coil to remove the residual magnetic field is arranged in the neighborhood of the objective lens of the SEM. This method is bothersome to execute, however, in view of the need of demagnetization of the SEM objective lens each time the operation is switched from the SEM to the FIB apparatus.

In microprocessing a sample by the FIB apparatus while at the same time observing the sample under the SEM, an out lens not leaking the magnetic field is conventionally used as an objective lens of the SEM. With the increase in demand for a higher resolution of the SEM, however, the use of an objective lens of semi-in type has become unavoidable. Thus, a technique is in demand to realize the FIB apparatus and the FIB-SEM in which neither isotopes of the ion beams are not separated nor the position of the ion beam spot is not changed on the sample against the existence or a change of a magnetic field on the optical axis of the ion beam.

SUMMARY OF THE INVENTION

In view of the present situation of the FIB apparatus described above, it is an object of this invention to provide a focused ion beam apparatus and a focused ion beam irradiation method in which even in the case where a magnetic field exists or changes on the optical axis of an ion beam, the isotopes of the ion beam are not separated on the sample and the ion beam is focused at the beam spot position in the same manner as if a magnetic field is absent, and in the case where the FIB apparatus is combined with a SEM to make up a FIB-SEM, the sample can be microprocessed by the FIB apparatus while at the same time making it possible to observe a sample image with a high resolution under the SEM.

In order to achieve this object, an optics is configured that an area where the components of the magnetic field perpendicular to the optical axis of the ion beam assume opposite directions exists on the optical axis of the ion beam, with the result that the beam spot is located on the same position on the sample as if a magnetic field is absent. With this configuration, even though a plurality of types of isotopes contained in the ion beam are separated and proceed along different optical paths, the ion beams of all the isotopes are focused again at the same beam spot position.

Especially in the case of the FIB-SEM, the primary source of the magnetic field is the objective lens of the SEM. In the narrow area in the neighborhood of the optical axis of the SEM, a downward (or upward) strong magnetic field exists, while an upward (or downward) weak magnetic field is exerted in the wide area outside the objective lens. The above mentioned effect can be produced by configuring the ion beam optics to pass through the two magnetic fields in an appropriate ratio.

For fine adjustment of the ion beam spot position, the desired magnetic field should be positively generated from a canceling magnetic field generating unit arranged on the optical beam of the ion beam. As long as the canceling magnetic field has a magnitude proportional to the external magnetic fields (including the magnetic field from the SEM objective lens of the FIB-SEM), the above-mentioned effect can be maintained against any variation in the external magnetic fields.

According to this invention, there are provided a FIB apparatus and a FIB irradiation method in which even in the case where a magnetic field exists on the optical axis of the ion beam and undergoes a variation, the isotopes of the ion beam are not separated on a sample and the ion beam is focused at the same beam spot position as if in the absence of the magnetic field. Further, in the FIB-SEM configuration of the FIB apparatus and the SEM combined, the microprocessing of the sample by the FIB apparatus and the sample observation with high resolution by the SEM are realized at the same time.

Other objects, features and advantages of the invention will become apparent from the following description of the embodiments of the invention taken in conjunction with the accompanying drawings.

DESCRIPTION OF THE EMBODIMENTS

Embodiments of the invention are explained below with reference to the drawings. In the drawings, similar component parts are designated by the same reference numeral and not described again.

First Embodiment

Figure 1:
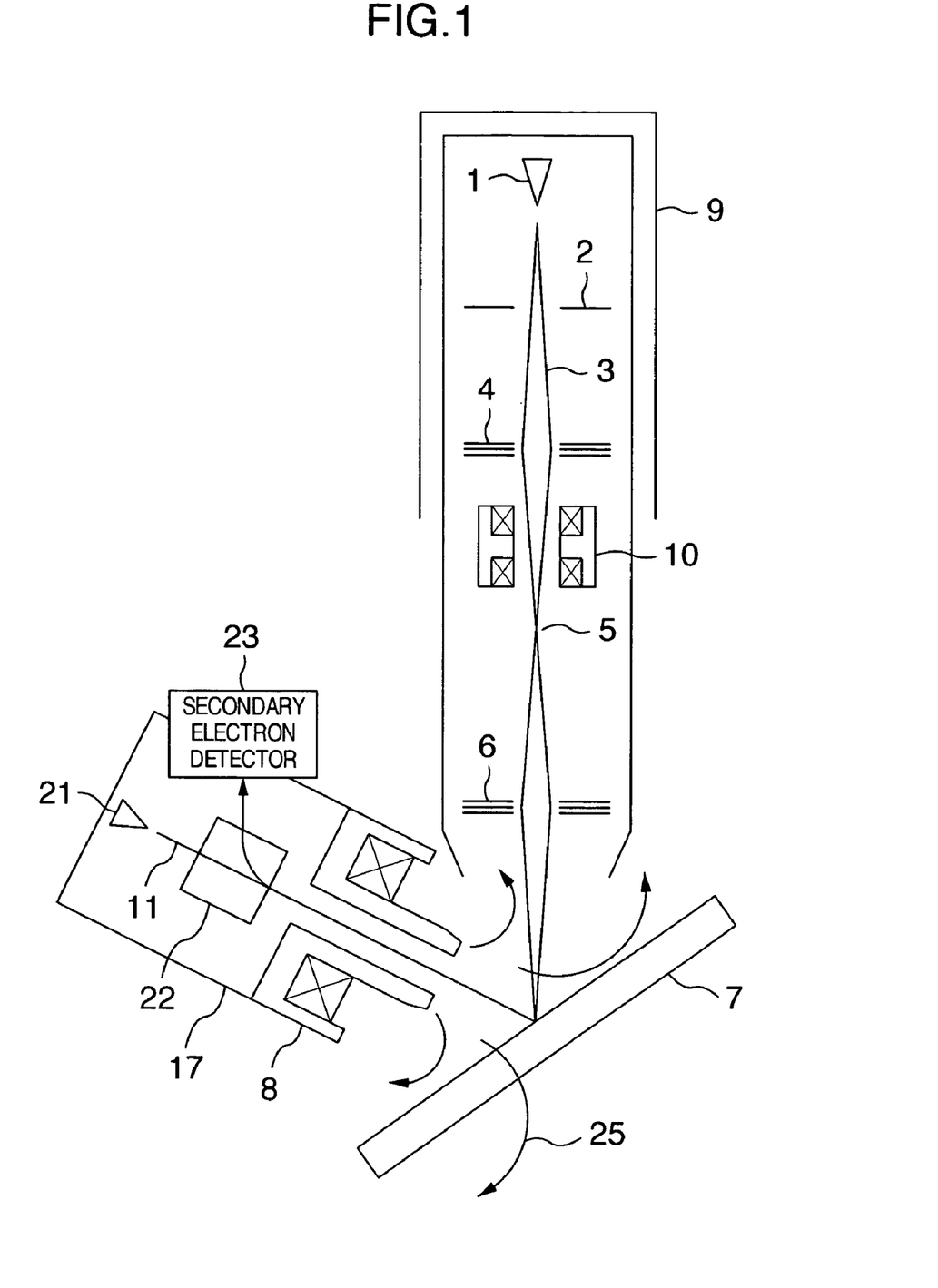
FIG. 1 is a diagram for explaining an optics according to a first embodiment of the invention.

FIG. 1 is a schematic diagram showing an example of a configuration of a FIB-SEM according to the invention. The Ga ions released from a Ga liquid metal ion source 1 are accelerated by the electric field generated by an accelerating electrode 2 and formed into, for example, a Ga ion beam 3 having a kinetic energy of, say, 30 keV. The ion beam is focused at a crossover 5 by an electric condenser lens 4 (or without any cross over, focused into a substantially parallel state), and further focused on a sample 7 by an electric objective lens 6. The Ga ion beam 3 is composed of two types of isotopes, $Ga^{69}$ and $Ga^{71}$ having contents in the ratio of 6 to 4.

The secondary electrons generated from the sample 7 irradiated with the ion beam are detected by a detector not shown, and the image of the sample can thus be observed. A SEM 17 is used, however, for observing the image of the sample with high resolution. The electron beam 11 of the SEM 17 is generated from a cathode 21, and after passing through an electro-optics including an accelerating electrode and a condenser lens not shown, focused on the sample by the objective lens 8 of the SEM, so that secondary electrons are generated from the surface of the sample. The secondary electrons, passing by the optical axis of the SEM 17, enter an ExB 22, and after being deflected by the magnetic and electric fields of the ExB 22, detected by a secondary electron detector 23. The electric and magnetic fields of the ExB 22 are adjusted to offset the effects thereof not to affect the electron beam 11 from the cathode. The optical axis of the ion beam 3 and the optical axis of the electron beam 11 of the SEM cross each other substantially at a single point on the sample 7. Therefore, the working area can be observed under the SEM while at the same time microprocessing the sample 7 by the ion beam 3. The wording "substantially at a single point" is indicative of the fact that the spot of the ion beam 3 on the sample 7 is so near as to be included in the visual field of the SEM 17, i.e. the scanning range of the electron beam 11. This distance is not more than 1 μm for the observation under the SEM with high resolution.

Figure 2:
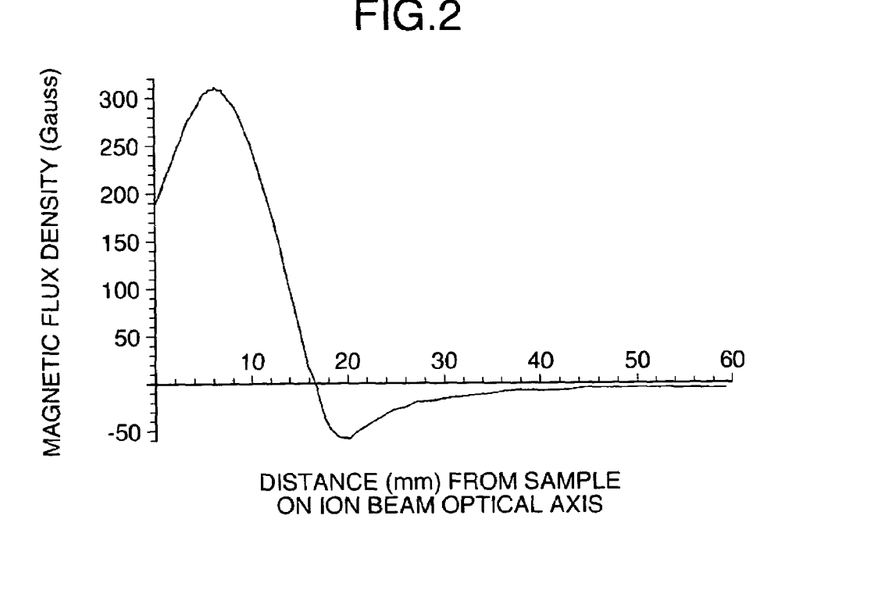
FIG. 2 is a diagram showing a magnetic field on the optical axis of an ion beam according to the first embodiment of the invention.

The SEM objective lens 8 is called a semi-in lens or snorkel lens by which the main lens surface is brought in proximity to the sample and the magnetic field is positively distributed toward the sample to secure a high resolution. Therefore, the magnetic field 25 generated from the SEM objective lens 8 is distributed on the optical axis of the ion beam 3. The components of this magnetic field perpendicular to the optical axis of the ion beam 3 deflect the ion beam 3 by the Lorentz force. These magnetic field components in the neighborhood of the SEM objective lens 8 and the other areas are directed oppositely, as shown in FIG. 2. In FIG. 2, the abscissa represents the coordinate on the optical axis of the ion beam with the ion beam spot position on the sample 7 as an origin.

Figure 3:
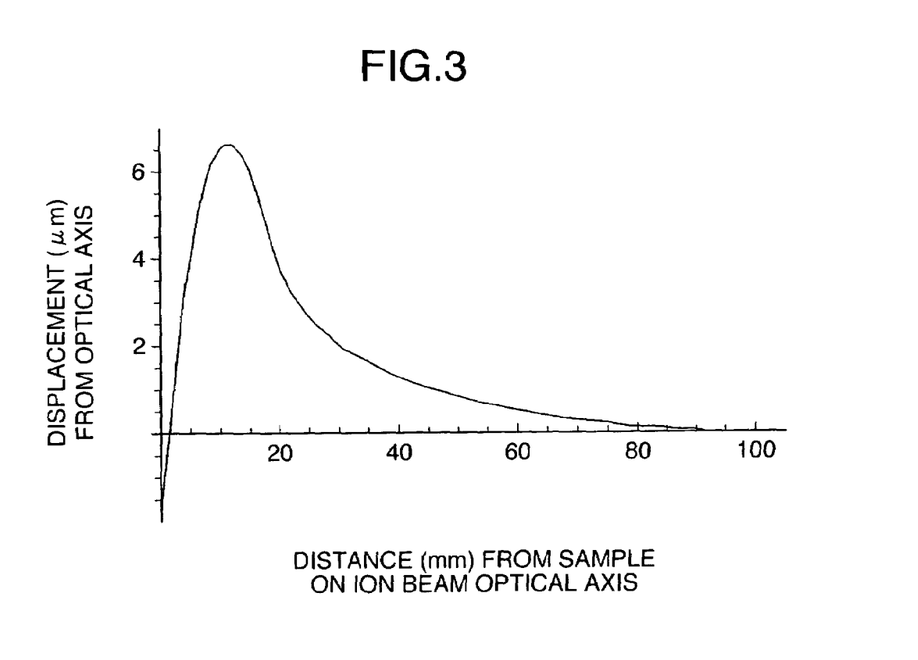
FIG. 3 is a diagram showing a track of an ion beam according to the first embodiment of the invention.

The area of the ion beam optical axis nearer to the ion source 1 is covered with a magnetic shield 9 and therefore has substantially no magnetic field. The ion beam 3 entering an area not covered by the magnetic shield 9 senses a magnetic field. As a result, the ion beam is deflected by the Lorentz force in the direction perpendicular to the page away from the reader. The ion beam 3 further proceeds and reaching the neighborhood of the SEM objective lens 8, senses a magnetic field in the opposite direction as understood from FIG. 2. As a result, the ion beam 3 is subjected to the Lorentz force perpendicular to the page toward the reader, and being deflected in that direction, reaches the surface of the sample 7. At this time, the ion beam spot is located almost but not exactly at the same position position as in the absence of the magnetic field. The area of the ion beam optics covered with the magnetic shield 9 is determined as near as possible to the position lacking the magnetic field. FIG. 3 shows the ion beam track in such a case.

Now, the displacement of the ion beam spot on the sample resulting from the ion beam deflection by the magnetic field described above is expressed by an equation. The equation of ion motion is given as shown in (1) below.

$$\frac{d^2 r}{dt^2} = \frac{q}{m}(v \times B(r) + E(r)) \quad (1)$$

In this equation, r is a position vector of ions, v a rate vector of ions, B(r), E(r) a magnetic field vector and an electric field vector, respectively, m an ion mass, q an ion charge and t the time. The coordinate system used in this case is a right-handed system having an origin at the beam spot position on the sample in the absence of a magnetic field, the z axis along the ion beam optical axis and the x axis perpendicular to the magnetic field, i.e. in the direction of beam deflection. The direction of the magnetic field on the optical axis is contained in the yz plane.

In equation (1), E(r) corresponds to the electric field of the objective lens 6 of the ion beam optics. As compared with the velocity vz along the optical axis, vx, vy are negligibly small. Equation (1) for the x component, therefore, is written as shown below.

$$\frac{d^2 x}{dt^2} = \frac{e}{m}(B_y(z) v_z(z) + E_x(z)) \quad (2)$$

The equation for y direction is the same as in the absence of a magnetic field and not described. As for the z direction, the following equation equivalent to the equation of motion is conveniently used. This indicates the energy conservation rule.

$$v_z(z) = \sqrt{\frac{2e(V_{acc} - \phi(z))}{m}} \quad (3)$$

where Vacc is the accelerating voltage, and Φ (z) the electric potential for z. The left side of equation (2) is modified to obtain the following equation.

$$\frac{d^2 x}{dt^2} = \frac{dz}{dt}\frac{d}{dz}\left(\frac{dz}{dt}\frac{dx}{dz}\right) \quad (4)$$

$$= v(z)\frac{d}{dz}\left(v(z)\frac{dx}{dz}\right)$$

Equations (4) and (3) are substituted into equation (2) and integrated. Then, the displacement Δx of the beam spot on the sample is obtained. The distance from the point of emission of the ion beam to the sample is designated as L. The emission point may be anywhere on the optical axis not covered by the magnetic field.

$$\Delta x = \frac{e}{m}\int_L^0 \frac{dz_1}{v(z_1)}\int_L^{z_1} \frac{B_y(z)v_z(z) + E_x(z)}{v(z)} dz \quad (5)$$

$$= \frac{e}{m}\int_L^0 \sqrt{\frac{m}{2e(V_{acc} - \phi(z_1))}} dz_1 \int_L^{z_1}\left(B_y(z) + E_x(z)\sqrt{\frac{m}{2e(V_{acc} - \phi(z))}}\right)dz$$

$$= \frac{e}{\sqrt{m}}\int_L^0 \frac{dz_1}{\sqrt{2e(V_{acc} - \phi(z_1))}}\int_L^{z_1} B_y(z) dz +$$

$$\frac{1}{2}\int_L^0 \frac{1}{\sqrt{(V_{acc} - \phi(z_1))}} dz_1 \int_L^{z_1}\left(\frac{E_x(z)}{\sqrt{(V_{acc} - \phi(z))}}\right) dz$$

In equation (5), the second term contains neither the mass of ions nor a magnetic field. In other words, this equation corresponds to the beam in the absence of a magnetic field and represents the displacement due to the objective lens of the FIB. Since Ex is zero for the beam passing through the optical axis, the beam passes through the origin. The first term depends on the magnetic field. This term is inversely proportional to $\sqrt{m}$ and therefore corresponds to the separation of isotopes by the magnetic field. Let Δm be the mass difference of the isotopes, and the isotope separation width δ is given by equation (6).

$$\delta = \frac{\Delta x}{2}\frac{\Delta m}{m} \quad (6)$$

The position of the end surface of the magnetic shield 9 nearer to the sample is determined at a value equal to L minimizing the first term of equation (5).

The magnetic field By(z) can be adjusted any time in such a manner that the integration of the first term is complete zero by superposing an appropriate canceling magnetic field on the leakage magnetic field from the SEM objective lens 8. By generating this canceling magnetic field on the optical axis, the first term of equation (5) is deleted. Then, the effect of the magnetic field can be completely eliminated within the range of first order approximation to the beam spot position on the sample. In other words, equation (5) indicates that the deflection of the beam and the separation of isotopes due to the magnetic field can be offset with each other.

Figure 4A:
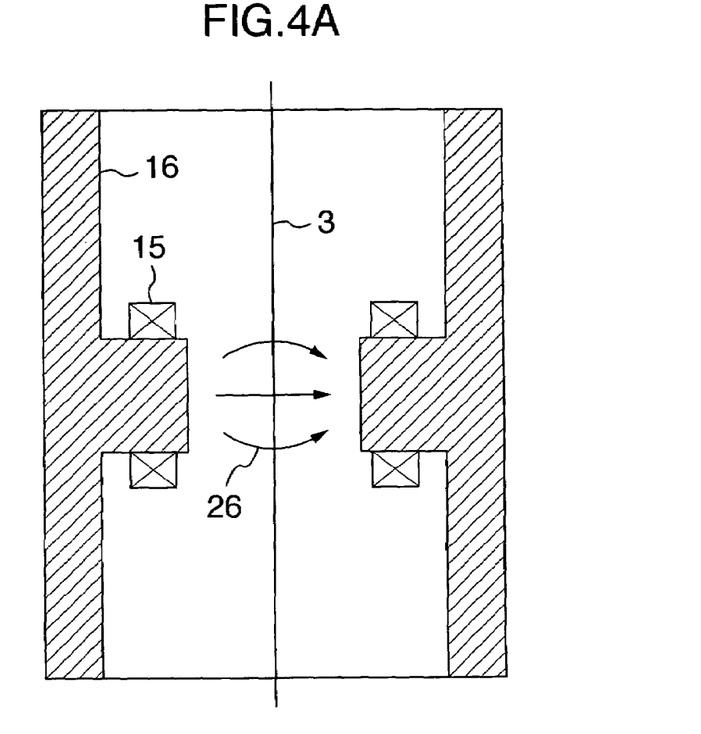
FIG. 4A is a sectional view of a canceling magnetic field generator according to the first embodiment of the invention.
Figure 4B:
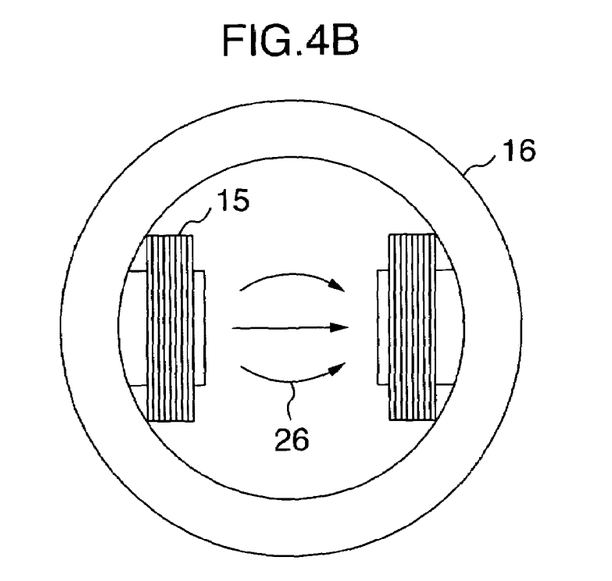
FIG. 4B is a plan view of a canceling magnetic field generator according to the first embodiment of the invention.

Based on this idea, this embodiment uses a canceling magnetic field generator 10 to assure complete coincidence of the ion beam spot position with the position associated with the absence of the magnetic field. The canceling magnetic field generator 10, as shown in FIGS. 4A, 4B, is configured of a pair of opposed coils 15 and a magnetic yoke 16 of permalloy. This magnetic yoke 16 has the function as a magnetic shield for both generating a canceling magnetic field efficiently on the ion beam optical axis and suppressing the leakage magnetic field out of the coils 15 at the same time. The material of the magnetic yoke 16 is not limited to permalloy but may be any magnetic material such as pure iron or permendule having a high permeability and a low coercive force. The higher the permeability, the smaller the external leakage magnetic field can be. The canceling magnetic field generator 10 has a central beam path arranged in alignment with the ion beam optical axis. The beam path of the canceling magnetic field generator 10 has a sufficient diameter to pass the whole ion beam passed through the condenser lens 4.

The canceling magnetic field 26 is generated on the ion beam optical axis 3 in the direction parallel to the page and perpendicular to the ion beam optical axis 3. In this way, the Lorentz force is exerted on the ion beam in the direction perpendicular to the page and the optical axis. This direction is parallel to the Lorentz force due to the magnetic field from the SEM objective lens 8, and therefore by appropriately adjusting the direction and magnitude of the canceling magnetic field, the position of the ion beam spot on the sample 7 can be completely rendered coincident with the position in the absence of a magnetic field. Arithmetically, the first term of equation (5) can be reduced to zero. The beam spot is not necessarily circular in shape. This theory according to the invention effectively holds even in the case where the cross section of the beam is elliptic or linear under the effect of stigmatic aberration or the like. The term "beam spot" referred to in this specification can assume any shape.

Figure 4C:
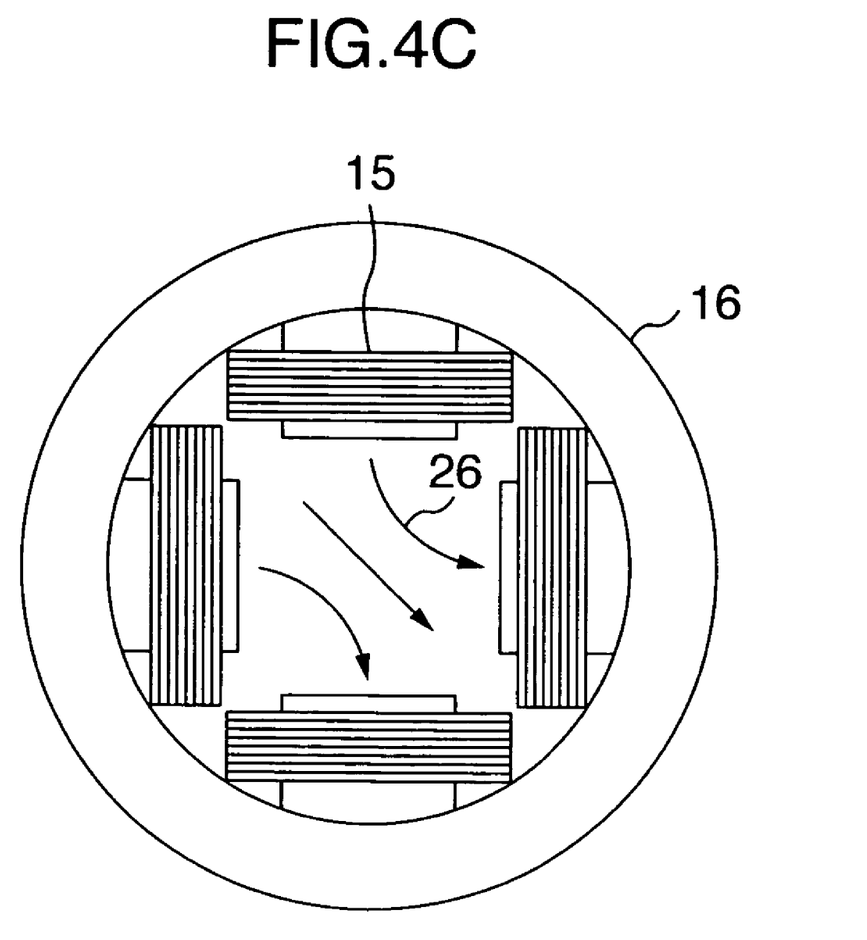
FIG. 4C is a plan view of a canceling magnetic field generator when two pairs of canceling coil in the first embodiment is utilized.

The canceling magnetic field generator 10, though adapted to be located at any point on the ion beam optical axis, is better located at such a distance from the sample 7 as not to disturb the magnetic field of the SEM objective lens 8. According to this embodiment, the canceling magnetic field generator 10 is arranged at the position 100 mm from the beam spot point on the sample 7. Also, the canceling magnetic field is effective over an area 10 mm long. FIGS. 4A, 4B show a pair of coils 15. Nevertheless, two or more pairs of coils may be used. In the case where two or more pairs of coils are used, the direction as well as the magnitude of the canceling magnetic field can be conveniently set freely. FIG. 4C corresponding to FIG. 4B shows a case having two pairs of coils.

Figure 5:
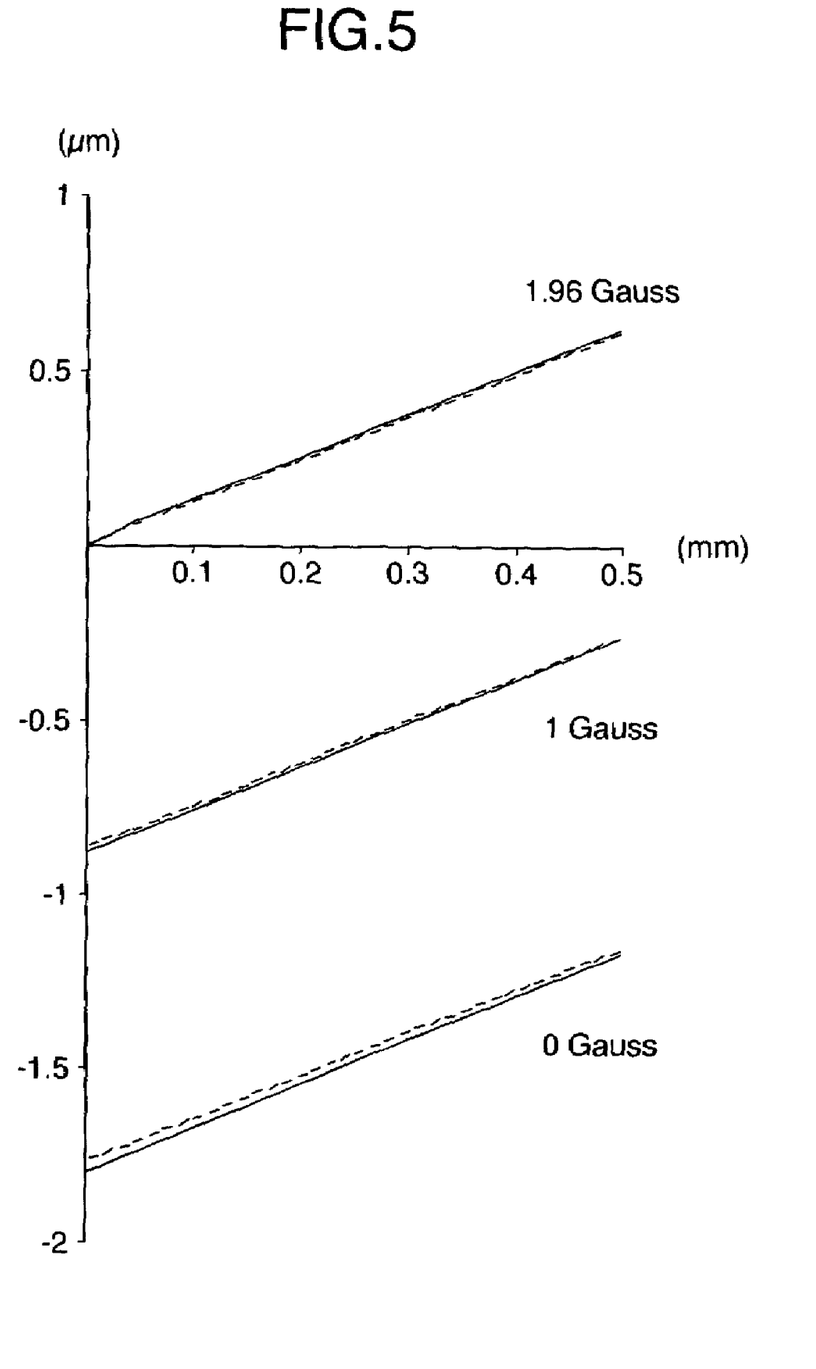
FIG. 5 is a diagram showing an ion beam track in the neighborhood of a sample according to the first embodiment of the invention.

FIG. 5 shows the state of the ion beam tracks in the neighborhood of the sample with the magnetic field of the canceling magnetic field generator 10 changed. The solid line indicates the track of $Ga^{69}$ and the dashed line that of $Ga^{71}$. The ordinate has an origin at the ion beam spot position in the absence of a magnetic field. The abscissa represents the distance from the ion beam spot position on the sample along the ion beam optical axis. In the presence of a magnetic field, the ion beam is split according to the mass-to-charge ratio of the ions, while the split width on the sample is proportional to the displacement of the ion beam spot from the origin on the sample. As understood from FIG. 5, therefore, the smaller the displacement of the ion beam spot from the origin, the smaller the width by which two types of isotopes are separated from each other. According to this embodiment, the ion beam passes through the origin while the width by which the isotopes are separated is about zero in the case where the magnetic flux density of the canceling magnetic field is 1.96 Gauss. In this case, the angle of incidence of the ion beam 3 to the sample 7 is about 1 mrad, and the maximum displacement of the ion beam 3 from the optical axis is not more than 6 µm. Thus, the effect on the performance such as the aberration of the ion beam optics can be neglected.

Figure 6:
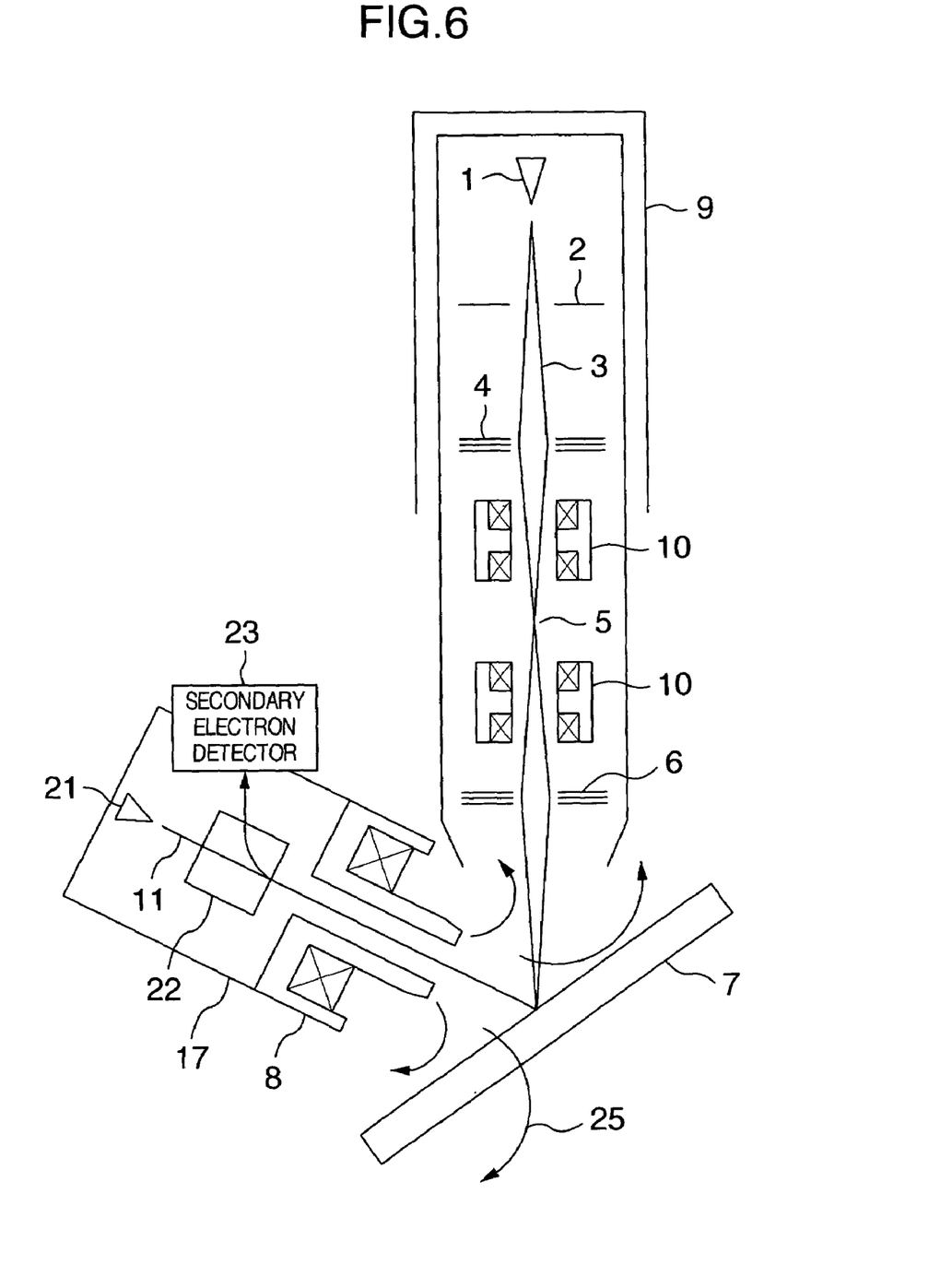
FIG. 6 is a diagram for explaining an optics with two serial stages of the canceling magnetic field generator according to the first embodiment of the invention.

Once the ion beam is deviated considerably from the center of the objective lens 6, the resolution of the focused ion beam is deteriorated as the result of the beam spot being increased due to the off-axis aberrations of the objective lens 6. In such a case, as shown in FIG. 6, the provision of two serial stages of the canceling magnetic field generator 10 makes it possible for the ion beam 3 to pass through the center of the objective lens 6 without splitting the ion beam spot.

Figure 7:
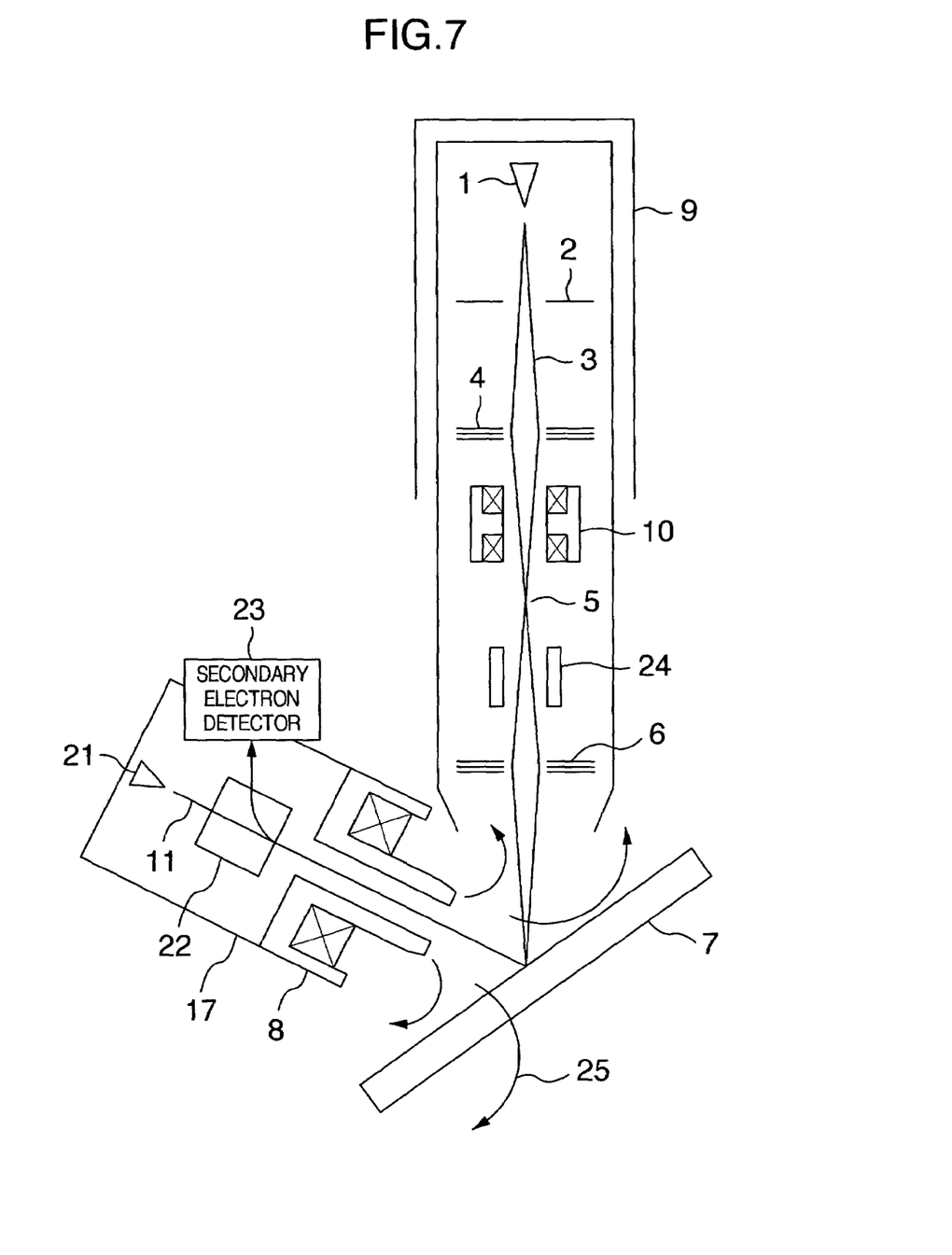
FIG. 7 is a diagram for explaining an optics with a configuration in which an electric deflector is added to the optics shown in FIG. 1 in such a manner that the ion beam passes through the center of an objective lens according to the first embodiment.

Also, as shown in FIG. 7, with a single stage of the canceling magnetic field generator 10, the ion beam 3 may be adjusted to pass through the center of the objective lens 6 using an electric deflector 24. The change in the ion beam track by the electric deflector 24 is not dependent on the mass-to-charge ratio of ions, and therefore the ion beam spot is not split by the electric deflector 24. Also in this case, therefore, the ion beam 3 can be passed through the center of the objective lens 6 without splitting the ion beam spot.

The embodiment described above refers to a case in which the ion beam contains the ion species of $Ga^{69}$ and $Ga^{71}$. Nevertheless, the ion species contained in the ion beam are not limited to $Ga^{69}$ and $Ga^{71}$. A well-known ion specie other than Ga is Sn. In this case, ions such as $Sn^+$, $Sn2^+$ and $Sn^{2+}$ are generated at the same time. A plurality of ion species having different mass-to-charge ratios are contained not only in the isotope but also in the allotrope. Also, ions of different valences and a mixture of completely different materials are available. According to this invention, in all of these cases, like in this embodiment, the ion beam spot can be formed without being split at the same position on the sample as in the absence of a magnetic field.

Second Embodiment

Figure 8:
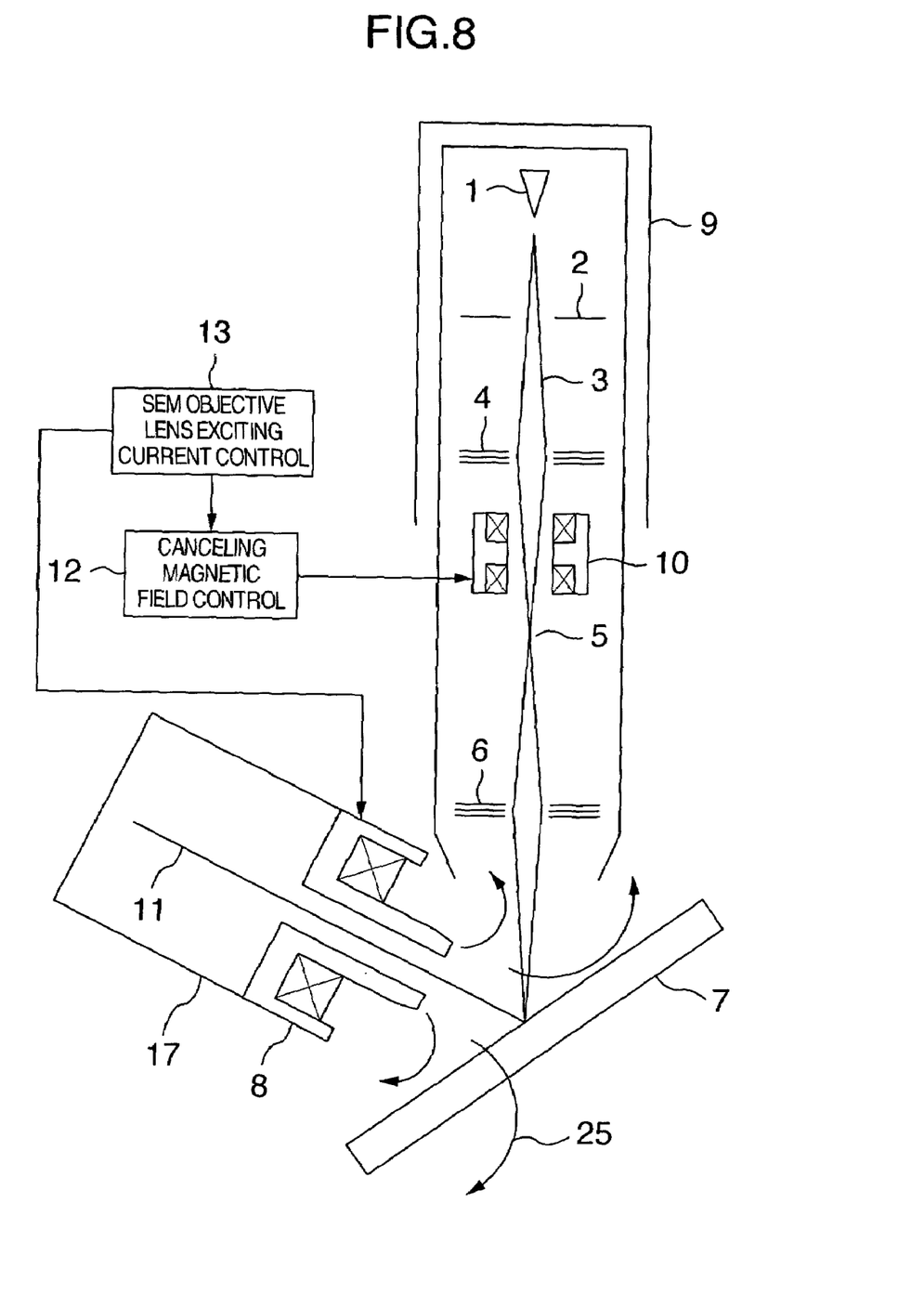
FIG. 8 is a diagram for explaining an optics according to a second embodiment of the invention.

FIG. 8 is a schematic diagram showing another example of a configuration of the FIB-SEM according to the invention. Normally, the excitation of the objective lens 8 of the SEM 11 is required to be changed frequently to change the focal length or the accelerating voltage. In line with this, the magnitude of the magnetic field on the ion beam optical axis of the FIB apparatus is changed, with the result that the ion beam spot on the sample 7 is displaced and in proportion to this displacement, the isotopes are separated.

To solve the aforementioned problem, this embodiment includes a canceling magnetic field control unit 12. The canceling magnetic field control unit 12, upon receipt of a signal proportional to the exciting current of the SEM objective lens 8 from a SEM objective lens exciting current control unit 13, supplies the coil of the canceling magnetic field generator 10 with a current proportional to the particular signal. The displacement of the ion beam spot on the sample 7 is proportional to the magnitude of the magnetic field on the ion beam optical axis 3. In the configuration according to this embodiment, therefore, the ion beam spot is always maintained at the origin, i.e. at the ion beam spot position in the absence of a magnetic field, and the isotopes are not separated even in the case where the magnetic field generated by the SEM objective lens 8 is changed considerably.

Third Embodiment

Figure 9:
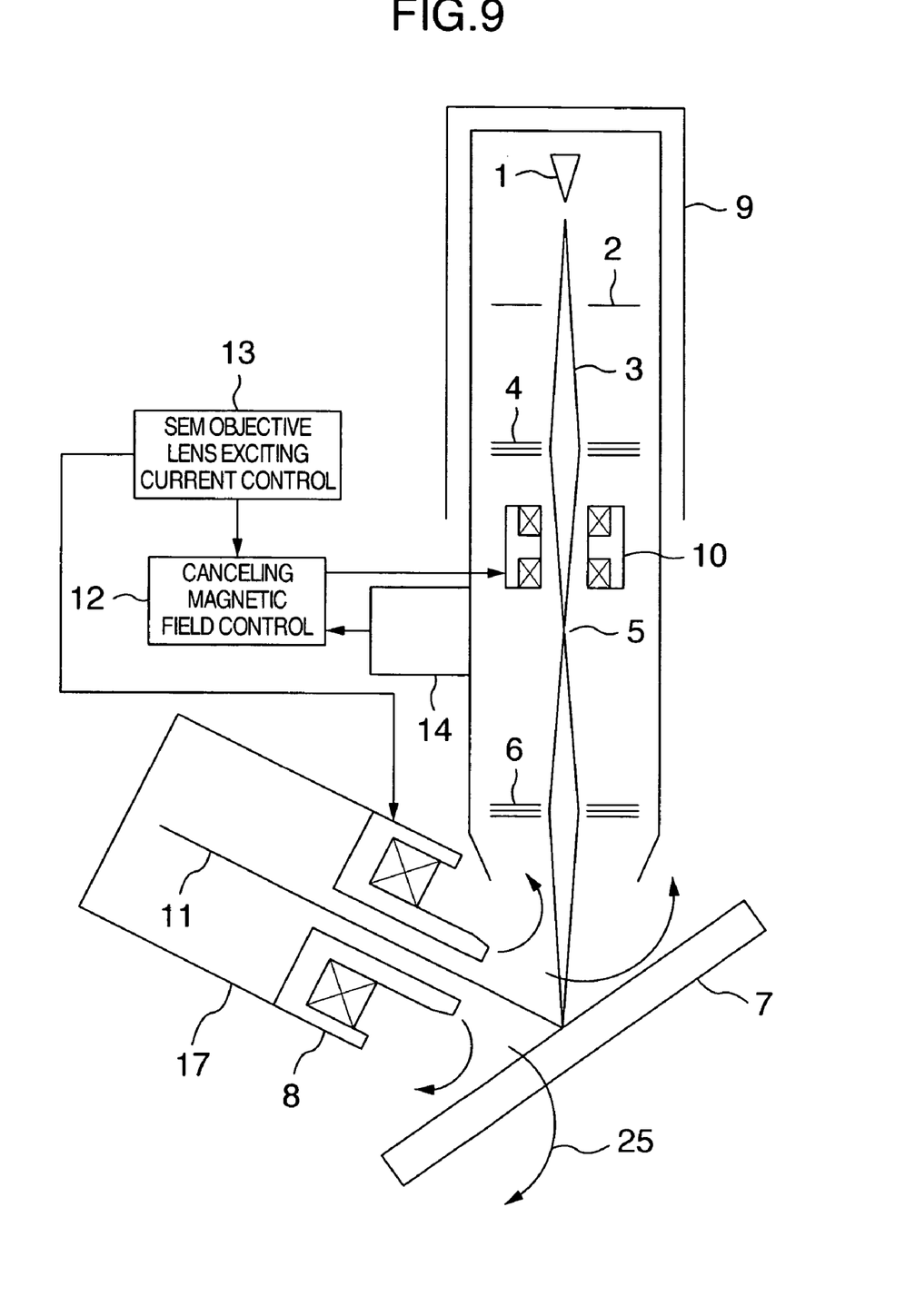
FIG. 9 is a diagram for explaining an optics according to a third embodiment of the invention.

FIG. 9 is a schematic diagram showing another example of a configuration of the FIB-SEM according to the invention. In the case where an external magnetic field for deflecting the ion beam 3 exists in addition to the magnetic field generated by the SEM objective lens 8 and changes in magnitude, the actually existing magnetic fields are effectively measured. According to this embodiment, as shown in FIG. 9, an output of a magnetic field sensor 14 is input to the canceling magnetic field control unit 12. Although a Hall element is used as the magnetic field sensor 14 in this embodiment, any other element capable of measuring the magnetic field such as a magnetoresistive element can be used. In the case where no magnetic field is generated by the SEM objective lens 8, the canceling magnetic field control unit 12 supplies the coils of the canceling magnetic field generator 10 with a current proportional to the magnetic field measured by the magnetic field sensor 14.

Normally, the relative spatial distribution of the magnetic field can be considered constant, and only the intensity factor thereof changes uniformly. It is therefore sufficient to measure the intensity of the magnetic field only in one arbitrary direction at an arbitrary point in a sample room. To improve the measurement sensitivity, however, the position and direction of measurement should be selected where the intensity of the magnetic field to be measured is as high as possible. In the presence of a plurality of sources of the magnetic field, the relative spatial distribution of the magnetic field in the sample room may also undergo a change. In such a case, the outputs of a plurality of magnetic field sensors are input to the canceling magnetic field control unit 12, which supplies the coils of the canceling magnetic field generator 12 with a current proportional to the linear combination of a plurality of inputs. As a result, a highly accurate correction is made possible even in the case where the relative spatial distribution of the magnetic field undergoes a change.

In the case where the magnetic field generated by the SEM objective lens 8 also undergoes a change, the canceling magnetic field control unit 12 supplies the coils of the canceling magnetic field generator 10 with a current corresponding to a linear coupling, at an appropriate ratio, between an input signal proportional to the exciting current of the SEM objective lens 8 from the SEM objective lens exciting current control unit 13 and the input signal from the magnetic field sensor 14.

The displacement of the ion beam spot on the sample 7 is proportional to the magnitude of the magnetic field on the ion beam optical axis 3. With the configuration according to this embodiment, therefore, the ion beam spot is always maintained at the origin, i.e. at the ion beam spot position in the absence of a magnetic field and the isotopes are not separated even in the case where at least one of the magnetic field generated by the SEM objective lens 8 and an external magnetic field undergoes a change.

Fourth Embodiment

Figure 10:
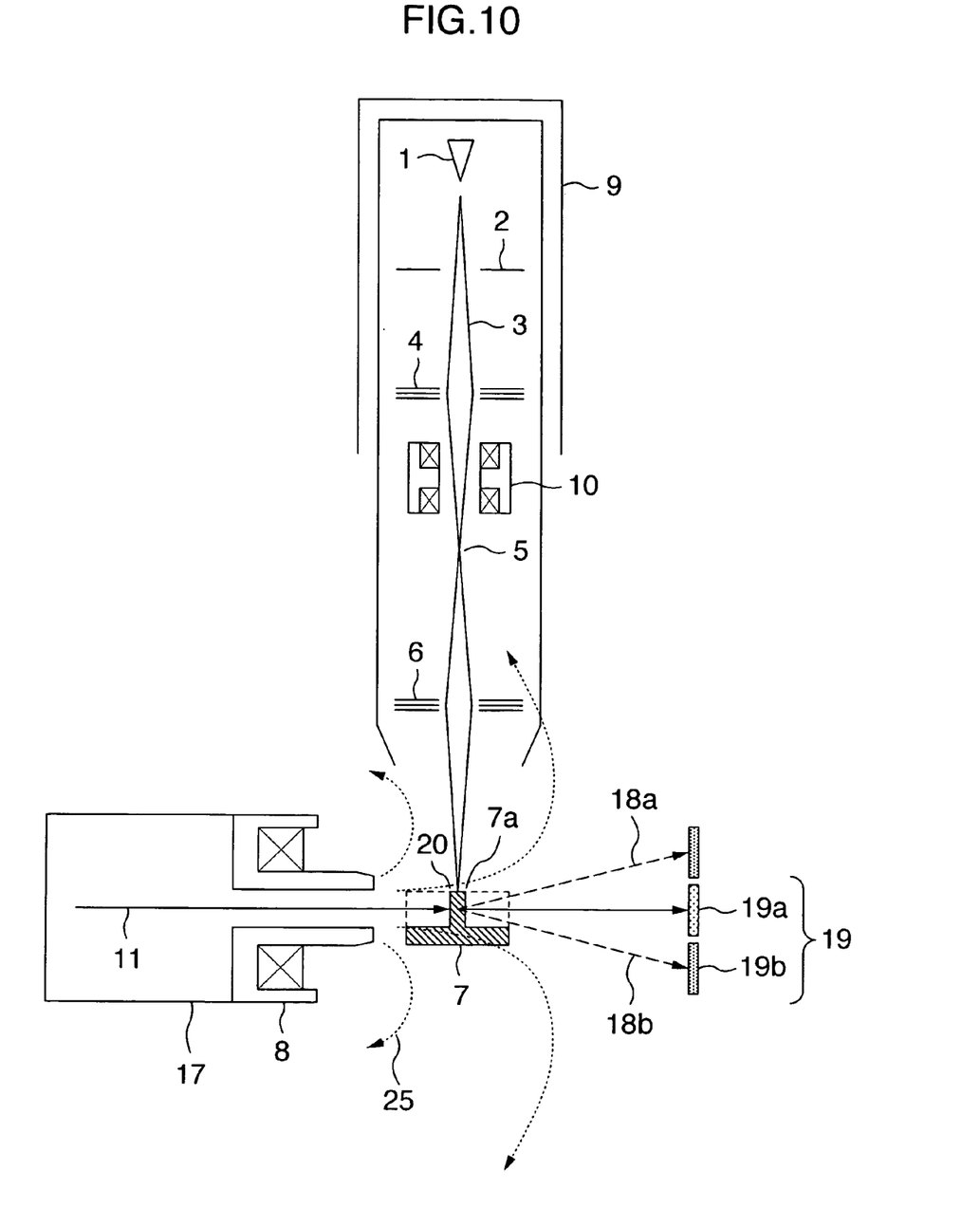
FIG. 10 is a diagram for explaining an optics according to a fourth embodiment of the invention.

FIG. 10 is a schematic diagram showing still another example of a configuration of the FIB-SEM according to the invention. The optical axis of the electron beam 11 of the SEM 17 and the optical axis of the ion beam 3 cross each other substantially perpendicularly to each other at about a single point 20 of the sample 7, and an electron detector 19 is arranged on the optical axis of the electron beam 11 of the SEM 17 on the side of the crossing 20 far from the SEM objective lens 8. According to this embodiment, the SEM is used as a scanning transmission electron microscope (STEM). The desired portion for observation of the sample 7 under the STEM and the surrounding portion are processed by FIB in such a manner that the particular desired portion remains as a thin film 7a. Also, the optical path of the electron beam 11 entering the thin film sample 7a and the transmitted electron beam 18 transmitted through the thin film sample 7a and proceeds toward the electron detector 19 are secured by FIB processing. The transmitted electron beam 18 includes a small angle scattering transmitted electron beam 18a proceeding in substantially the same direction as the the incident beam and a wide angle scattering transmitted beam 18b considerably displaced out of the direction of incidence, each being detected by electron detectors 19a and 19b, respectively. A scanning image is formed from the signal of each detector as a brightness signal in synchronism with the scanning of the incident electrons. Then, a bright field image and a dark field image are obtained. The scattering angle distribution of the transmitted electrons is greatly dependent on the atom number of the sample, so that the larger the atom number, the larger the degree of wide angle scattering. Therefore, an image having a strong atom number contrast is obtained.

The feature of this embodiment lies in that the electron beam axis and the ion beam axis are arranged substantially at right angles to each other, so that the thin film sample 7a being processed by the FIB can be observed as a STEM image on a monitor without moving the sample 7. As a result, the invention exhibits an especially great effect for an application of observation of the pinpoint processing to analyze a defect of a device or the like. The sample 7 may be a small piece separated in advance from a wafer or the like, or a micro sample collected by the microsampling process from a wafer in the same sample room. The deflection of the ion beam 3 or the separation of the isotopes on the sample due to the leakage magnetic field affecting the sample 7 from the objective lens 8 of the SEM 17 can be obviated by the canceling magnetic field generator 10. The SEM objective lens 8, therefore, can be arranged with the forward end thereof as near as 4 to 8 mm from the sample observation point. Consequently, the high-resolution SEM/STEM observation is made possible.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A focused ion beam apparatus comprising:
   a scanning electron microscope having an objective lens that generates a magnetic field on a sample;
   an ion source;
   a focused ion beam optics to focus the ion beam emitted from the ion source on the sample;
   a canceling magnetic field generator to generate a canceling magnetic field on the optical axis of the ion beam; and
   a canceling magnetic field control unit for controlling the canceling magnetic field generated from the canceling magnetic field generator with the exciting current of the objective lens of the scanning electron microscope as an input signal thereto,
   wherein the deflection of the ion beam under the effect of a magnetic field external to the focused ion beam optics is canceled.

2. A focused ion beam apparatus according to claim 1, wherein the optical axis of the scanning electron microscope and the optical axis of the ion beam cross each other at a substantially single point on the sample.

3. A focused ion beam apparatus according to claim 2, wherein the optical axis of the scanning electron microscope and the optical axis of the ion beam cross each other substantially at 90 degrees to each other, and
   wherein an electron detector is arranged on the optical axis of the scanning electron microscope on the side of the crossing point far from the objective lens of the scanning electron microscope.

4. A focused ion beam apparatus according to claim 1, further comprising a magnetic shield for covering the focused ion beam optics.

5. A focused ion beam apparatus according to claim 4, wherein the magnetic shield covers the part of the focused ion beam optics far from the sample, and wherein the distance L from the end surface of the magnetic shield nearer to the sample to the sample is given as $$\int_L^0 \frac{dz_1}{\sqrt{V_{acc} - \phi(z_1)}} \int_L^{z_1} B_y(z) dz \cong 0$$

where Vacc is the ion beam accelerating voltage, $\Phi(z_1)$ the electric potential at the coordinate $z_1$ on the optical axis of the ion beam, By(z) a magnetic field component perpendicular to the optical axis of the ion beam at the coordinate z on the optical axis, and the origin of the coordinate is located at the ion beam spot position on the sample in the absence of a magnetic field.

6. A focused ion beam apparatus according to claim 1, wherein the ion beam includes a plurality of ion beams having a plurality of different mass-to-charge ratios.

7. A focused ion beam apparatus according to claim 6, wherein the ion beams having the plurality of different mass-to-charge ratios are a plurality of types of isotope ion beams.

8. A focused ion beam apparatus according to claim 1, wherein the ion source is a Ga liquid metal ion source.

9. A focused ion beam apparatus according to claim 1, wherein the canceling magnetic field generator is arranged on the optical axis of the ion beam and has a beam path allowing the entire the ion beam to pass therethrough.

10. A focused ion beam apparatus according to claim 9, wherein the canceling magnetic field generator is covered by a magnetic shield.

11. A focused ion beam apparats comprising:
a scanning electron microscope having an objective lens that generates a magnetic field on a sample;
an ion source;
a focused ion beam optics to focus the ion beam emitted form the ion source on a sample; and
a canceling magnetic field generator to generate a canceling magnetic field on the optical axis of the ion beam;
at least one magnetic field sensor in the neighborhood of the focused ion beam optics; and
a canceling magnetic field control unit for controlling the canceling magnetic field generated from the canceling magnetic field generator with the output of the magnetic field sensor as an input signal thereto,
wherein the deflection of the ion beam under the effect of a magnetic field external to the focused ion beam optics is canceled.

12. A focused ion beam apparatus according to claim 11, wherein the optical axis of the scanning electron microscope and the optical axis of the ion beam cross each other at a substantially single point on the sample.

13. A focused ion beam apparatus according to claim 12, wherein the optical axis of the scanning electron microscope and the optical axis of the ion beam cross each other substantially at 90 degrees to each other, and
wherein an electron detector is arranged on the optical axis of the scanning electron microscope on the side of the crossing point far from the objective lens of the scanning electron microscope.

14. A focused ion beam apparatus according to claim 11, further comprising a magnetic shield for covering the focused ion beam optics.

15. A focused ion beam apparatus according to claim 14, wherein the magnetic shield covers the part of the focused ion beam optics far from the sample, and wherein the distance L from the end surface of the magnetic shield nearer to the sample to the sample is given as $$\int_L^0 \frac{dz_1}{\sqrt{V_{acc} - \phi(z_1)}} \int_L^{z_1} B_y(z) dz \cong 0$$

where Vacc is the ion beam accelerating voltage, $\Phi(z_1)$ the electric potential at the coordinate $z_1$ on the optical axis of the ion beam, By(z) a magnetic field component perpendicular to the optical axis of the ion beam at the coordinate z on the optical axis, and the origin of the coordinate is located at the ion beam spot position on the sample in the absence of a magnetic field.

16. A focused ion beam apparatus according to claim 11, wherein the ion beam includes a plurality of ion beams having a plurality of different mass-to-charge ratios.

17. A focused ion beam apparatus according to claim 16, wherein the ion beams having the plurality of different mass-to-charge ratios are a plurality of types of isotope ion beams.

18. A focused ion beam apparatus according to claim 11, wherein the ion source is a Ga liquid metal ion source.

19. A focused ion beam apparatus according to claim 11, wherein the canceling magnetic field generator is arranged on the optical axis of the ion beam and has a beam path allowing the entire the ion beam to pass therethrough.

20. A focused ion beam apparatus according to claim 19, wherein the canceling magnetic field generator is covered by a magnetic shield.

21. A focused ion beam apparatus comprising:
a scanning electron microscope having an objective lens that generates a magnetic field on a sample;
an ion source;
a focused ion beam optics to focus the ion beam emitted from the ion source on a sample; and
a canceling magnetic field generator to generate a canceling magnetic field on the optical axis of the ion beam; wherein:
the deflection of the ion beam under the effect of a magnetic field external to the focused ion beam optics is canceled,
the optical axis of the scanning electron microscope and the optical axis of the ion beam cross each other at a substantially single point on the sample,
the optical axis of the scanning electron microscope and the optical axis of the ion beam cross each other substantially at 90 degrees to each other, and
the apparatus further comprises an electron detector arranged on the optical axis of the scanning electron microscope on the side of the crossing point far from the objective lens of the scanning electron microscope.

22. A focused ion beam apparatus according to claim 21, further comprising a magnetic shield for covering the focused ion beam optics.

23. A focused ion beam apparatus according to claim 22, wherein the magnetic shield covers the part of the focused ion beam optics far from the sample, and wherein the distance L from the end surface of the magnetic shield nearer to the sample to the sample is given as $$\int_L^0 \frac{dz_1}{\sqrt{V_{acc} - \phi(z_1)}} \int_L^{z_1} B_y(z) dz \cong 0$$

where Vacc is the ion beam accelerating voltage, $\Phi(z_1)$ the electric potential at the coordinate $z_1$ on the optical axis of the ion beam, By(z) a magnetic field component perpendicular to the optical axis of the ion beam at the coordinate z on the optical axis, and the origin of the coordinate is located at the ion beam spot position on the sample in the absence of a magnetic field.

24. A focused ion beam apparatus according to claim 21, wherein the ion beam includes a plurality of ion beams having a plurality of different mass-to-charge ratios.

25. A focused ion beam apparatus according to claim 24, wherein the ion beams having the plurality of different mass-to-charge ratios are a plurality of types of isotope ion beams.

26. A focused ion beam apparatus according to claim 21, wherein the ion source is a Ga liquid metal ion source.

27. A focused ion beam apparatus according to claim 21, wherein the canceling magnetic field generator is arranged on the optical axis of the ion beam and has a beam path allowing the entire the ion beam to pass therethrough.

28. A focused ion beam apparatus according to claim 27, wherein the canceling magnetic field generator is covered by a magnetic shield.

* * * * *